(12) United States Patent
Moreau et al.

(10) Patent No.: US 6,673,521 B2
(45) Date of Patent: Jan. 6, 2004

(54) SUPERCRITICAL FLUID(SCF) SILYLATION PROCESS

(75) Inventors: Wayne M. Moreau, Wappingers Falls, NY (US); Kenneth J. McCullough, Fishkill, NY (US); David R. Medeiros, Ossining, NY (US); John P. Simons, Wappingers Falls, NY (US); Charles J. Taft, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/735,404

(22) Filed: Dec. 12, 2000

(65) Prior Publication Data

US 2003/0036023 A1 Feb. 20, 2003

(51) Int. Cl.$^7$ .................................................. G03F 7/26
(52) U.S. Cl. ........................ 430/315; 430/311; 430/313
(58) Field of Search ................................. 430/311, 313, 430/329, 331, 315; 134/1, 1.3

(56) References Cited

U.S. PATENT DOCUMENTS

| 6,306,564 B1 | * | 10/2001 | Mullee ........................ 430/329 |
| 6,506,914 B1 | * | 1/2003 | Tsuji et al. .................. 549/529 |
| 6,509,138 B2 | * | 1/2003 | Gleason et al. ............. 430/313 |

* cited by examiner

Primary Examiner—Kathleen Duda
(74) Attorney, Agent, or Firm—Thomas A. Beck; Daniel P. Morris

(57) ABSTRACT

A process of silylation of object surfaces using a mixture of a silylation agent in admixture with an inert liquified gas, such as carbon dioxide.

19 Claims, 3 Drawing Sheets

Figure 2 - After Silylation

SUPERCRITICAL FLUID(SCF) SILYLATION PROCESS

FIELD OF INVENTION

This invention relates to a process of silylation of object surfaces using a mixture of a silylation agent in admixture with an inert liquified gas, such as carbon dioxide.

BACKGROUND

As disclosed by W. Moreau, in *Semiconductor Lithography*, Plenum Press, 1987, pg 290, and Chapter 12, semiconductor surfaces or resist films can be modified by contacting and chemically reacting a silicon atom containing compound with the surface of a semiconductor resist film in a process called "silylation."

For example, a silylating agent, such as hexamethyldisilazane (HMDS), reacts with the hydroxy groups present in a silicon dioxide-containing surface, such as "Silanol," or the hydroxy groups present in a phenolic type resist, to form a silyl ether, e.g.:

—OH+(Me₃Si)₂NH ——— —OSiMe₃+Me₃SiNH₂

The HMDS treatment of silicon wafers is commonly used as an adhesion promotion step prior to coating resists. The treatment of resist polymers is used to form bilayer or top surface imaging resists, as disclosed in U.S. Pat. Nos. 4,613,398, 5,366,852, 5,217,851, 4,981,909, K. Suguta, et al., *Surface Silylation o DUV Lithography* Jap. J. Appl. Phys., 39,669–674(2000), W. Hay, et al., *Optimization of DUV Positive Tone Top Surface Imaging Process*, Microelectronic Engineering, 23, 255–258 (1994) and E. Pavelcheck, et al., *Process Techniques for Improving Performance of Positive Tone Silylation*, Optical Engineering, 32, 2376–2381(1993).

In the process of treating a photoresist image, a sufficient wt % (>7 wt %) of silylating agent is incorporated therein to act as an in-situ mask for subsequent development of the underlying resist layer by reactive ion etching in oxygen.

The major drawback of silylation from the gas phase or liquid phase using agents such as HMDS is the swelling of the resist image which can be irreproducible in a semiconductor process especially across the surface of large diameter (>4 inch diameter) wafers.

For liquid phase silylation using agents such as HMCTS (hexamethylcyclotrisilazane) or HMDS, organic co-solvents, such as xylene, benzene, toluene, etc. are used to preswell the resist to aid in the diffusion of the HMCTS into the resist further swelling the resist images especially for nanolithography scale (<500 nm images). The diffusion of organic liquids into a polymeric film are of the order of $10^{-5}$ cm²/sec.

Supercritical fluids, i.e., fluids which are brought to highly elevated temperatures and pressures, are an order of magnitude lower in viscosity than organic liquids and have diffusitvities of $10^{-4}$ to $10^{-2}$ cm²/sec (See: M. Mc Hugh and V. Krukonis, *Supercritical Fluid Extraction*, Butterworths-Heineimann, 1994, pg. 15). For the purpose of this invention, "supercritical fluids" embodies the fluids disclosed in the section of the *Kirk-Othmer Encyclopedia of Chemical Technology*, 3rd Edition, John Wiley & Sons, (1984) entitled: *Supercritical Fluids*, pages 872–877; as well as U.S. Pat. No. 5,508,510, the collective contents of which are hereby incorporated by reference herein.

According to U.S. Pat. No. 6,033,996 supercritical fluids of $CO_2$ have been used to clean residues from resist surfaces.

Silylating agents are described in U.S. Pat 6,074,804, (Non amine silylating agent); U.S. Pat. No. 5,866,434, (Toluene flammable solvent used for silylation nanotube fibers); U.S. Pat. No. 6,042,993, (Diaminopropyldimethylsiloxane silylation agent); U.S. Pat. No. 6,063,974, (Zeolite silylation); U.S. Pat. No. 6,045,870 (Silylation of polymers containing hydroxyl, epoxy, acid groups); U.S. Pat. No. 6,099,960 (Silanol based silylating agents); U.S. Pat. No. 6,025,025 (Perfluoroalkylsilane for water repellency silylation); and U.S. Pat. No. 5,550,007 (bis dimethylaminosilane silylating agents). These agents are suitable for use in the present invention, and are hereby incorporated by reference herein.

Synthesis reactions using silylation of reactive hydroxy groups to form silanols and bulk synthesis reaction as disclosed in U.S. Pat. No. 5,157,139, are commonly used in conjunction with flammable solvents such as toluene, acetone, and xylene.

An inert or nonflammable media to silylate objects is desired. Easy recovery of the unreacted silylating agent is also desirable. Finally a resist based on silylation of polyhdroxystyrene as disclosed in U.S. Pat No. 4,689,288 (Silylated polyhydroxystyrene positive acid cat resist) illustrates using a synthetic silylation reaction of a polymer. The references cited above are hereby incorporated by reference herein.

SUMMARY

The present invention relates to a method for silylation of such surfaces, found in films, fabrics, or workpieces which method utilizes a mixture of a silylation agent or other suitable organometallic reagent and a supercritical fluid or a liquified fluid.

More particularly, the instant invention relates to a process for rapidly treating photoresist films, semiconductor surfaces or other objects by using a mixture of a silylation agent and supercritical or liquified $CO_2$ with or without some cosolvent therein.

In the case of resists, the present invention provides an enhanced process for silylation of resists after exposure in a top surface imaging or post-silylation treatment of a developed resist image.

In a typical prior art process, hexamethyl disilazane (e.g., as described in U.S. Pat. No. 4,613,398) is used to form an oxygen resistant image for dry developing. One major problem is the facile incorporation of the silylation agent sufficiently deep into the resist surface. Swelling agents have to be used in conjunction with the silylation agent to aid in the diffusion of the hexamethyl disilazane-type treatment.

As noted above, the use of a supercritical or liquified $CO_2$ is used in conjunction with an organometallic reagent enhances, without swelling, the diffusion of the reagent into the film and provides unexpectedly higher resolution top surface imaging.

The process of the present invention can also be used to incorporate by silylation, silicon into an exposed resist, while simultaneously developing out a positive resist image using supercritical or liquified $CO_2$ medium.

The instant process incorporates organometallic reagents in a mixture with supercritical or liquified $CO_2$ and as noted, varying the pressure, time and temperature to achieve a higher resolution, or higher Si/organometallic incorporation into the resist film in a top surface or bilayer mode than heretofor achieved.

As a result of the discovery of the novel techniques of the instant process, an additional beneficial process has been developed whereby it is possible to use the instant silylation process carried out in a liquid fluid or a supercritical fluid as the solvent for the reaction media in the organic synthesis of a desired composition at the bulk level.

DETAILED DESCRIPTION OF THE DRAWINGS

Figure 1:
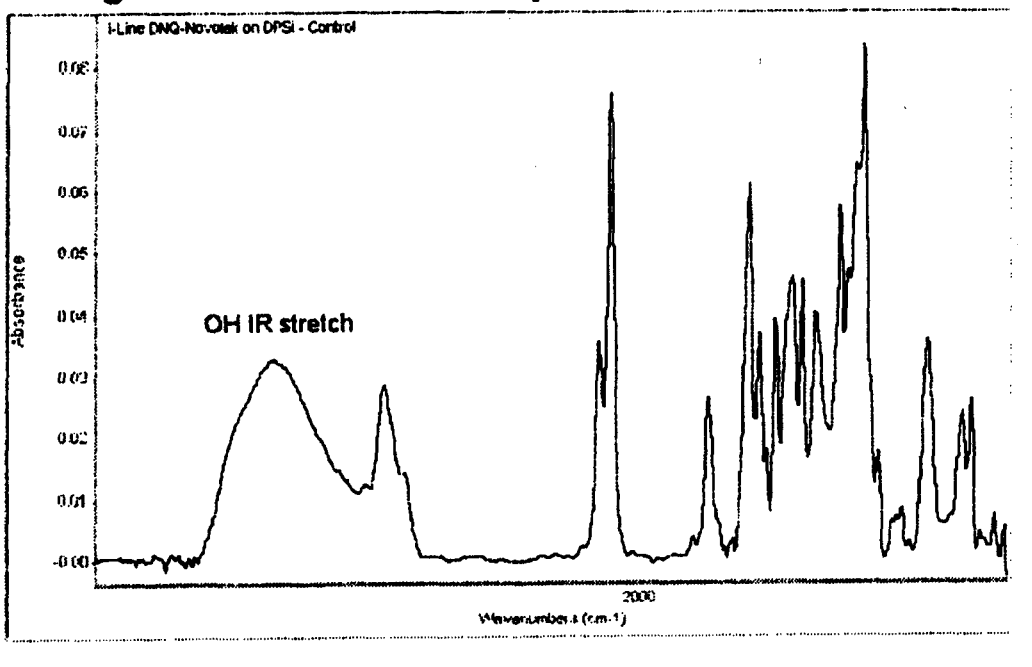
FIG. 1 depicts the spectrum of Novolak I resin line resist control with prominent —OH band at 3300 $cm^{-1}$.

The various features of novelty which characterize the invention are pointed out with particularity in the claims annexed to and forming a part of the disclosure. For a better understanding of the invention, its operating advantages and specific objects attained by its use, reference should be had to the drawings and descriptive matter which are illustrated and described in the preferred embodiments of the invention.

DETAILED DESCRIPTION OF THE PREFERRED EMBODIMENT

The process described hereinafter relates to treating a workpiece with a mixture of a silylating agent (<10 wt %) dissolved in a supercritical fluid or liquified fluid such as $CO_2$. The workpiece is immersed and contacted with the fluid at elevated pressure for a specific time and temperature sufficient to bring about the desirable level of silicon (silylation) into the surfaces or depth of the workpiece. These physical variables are adjusted to effectuate the desired degree of reaction.

The objects to be treated in accordance with the present invention is any workpiece as long as there is a rective moiety located substantially on the surface thereof. Obviously the other requirement is that the object will not decompose or dissolve during the course of the process. Examples of the objects to be treated in accordance with the present invention are photoresists, objects containing silicon dioxide at or about the surface of same, articles containing a lignin surface or fabrics having silicon dioxide moieties at or near the surface thereof.

The silylating agent can be any suitable silicon reagent.

More particularly, the silylating agent is an organosilicon compound selected from compounds having the following molecular formulas: $SiR_yX_{4-y}$ and $(R_w X_{3-w} Si)_2 Z$,
wherein:
y=1 to 4;
w=1 to 3;
R=alkyl, aryl, H, alkoxy, arylalkyl, fluoro, fluoroalkyl and where applicable, R has from 1 to 10 carbon atoms;
X=halide; and
Z=oxygen or amino, or imino or alkylimino or alkanoylimino.

Alternatively, the silylating agent can also include compounds wherein said silylation agent comprises reactive aminosilanes, $R_nSiX$, where R is aryl, alkyl alkoxy, fluoroaklyl, fluoraryl, fluoroalkoxy, and X is a halogen, amino, epoxy, isocyanate, —OH, or acid group and n is 1–4.

The most preferred embodiment among the useful Si-containing agents include: hexamethyl disilazane (HMDS), hexamethyl-cyclotrisilazane, trimethylsilyl ethyl isocyanate and/or dimethylsilyldimethylamine.

A preferred silylating agent is selected from the group of tetra-alkyl orthosilicates, $Si(OR)_4$, and poly(alkyl)siloxanes.

Further preferred silylating agents is tetraethyl orthosilicate, also known as tetraethoxysilane, and poly (phenylmethyl)siloxane.

All of these silylating agents are commercially available, the siloxanes being available from Dow Chemical Co. under tradenames such as Dow 200, Dow 510, Dow 550 and Dow 710.

Other representative examples of silylating agents are dimethyl silicone, diethyl silicone, phenylmethyl silicone, methylhydrogen silicone, ethylhydrogen silicone, phenylhydrogen silicone, methylethyl silicone, phenylethyl silicone, diphenyl silicone, methyltrifluoropropyl silicone, ethyltrifluoropropyl silicone, polydimethyl silicone, tetrachlorophenylethyl silicone, tetrachlorophenylmethyl silicone, tetrachlorophenylhydrogen silicone, tetrachlorophenylphenyl silicone, methylvinyl silicone and ethylvinyl silicone. Examples of cyclic silicones include hexamethyl cyclotrisiloxane, octamethyl cyclo-tetrasiloxane, hexaphenyl cyclotrisiloxane and octaphenyl cyclotetrasiloxane. Mixtures of the above can also be used.

Although the invention is based upon silylating agents, other organometallic materials can be used in a manner similar to the silylating agents disclosed above. Suitable organometallic materials are germanium, aluminum, tin, titanium and zinc.

Up to 10% by weight of certain fluids can be combined with the carbon dioxide preferably fluids which are non-reactive such as cyclohexanone, N-methyl pyrrolidone and THF. Other suitable fluids are ethane and acetonitrile.

The process can be conveniently carried out at pressures between about 1069 p.s.i. and 10,000 p.s.i at temperatures <200° C. for sufficient time to effect the desired reaction. Preferably the reaction pressure is 1600 p.s.i. to 6000 p.s.i. at 100° C.

EXAMPLE 1

A silicon wafer and glass slides were outgassed at 150° C. to remove surface water and then treated with a mixture of HMDS (2 wt % dissolved in supercritical $CO_2$ at 6000 psi and 70° C. for a period of 15 minutes). The silicon wafer surface after treatment was evaluated versus a control sample of silicon treated by a gas phase silyation in a gas phase silyation oven by Yield Integration Systems (YES). The contact angle of water drops of treated samples was compared with an untreated control and was measured. The higher contact angle with SCF treatment indicated a successful silylation to a more hydrophobic surface. (water repellant)

| Sample | CONTACT ANGLE(water drop)deg |
|---|---|
| Bare silicon wafer (untreated) | 26 |
| Silicon wafer silylated by HMDS in Gas Phase YES oven | 78 |
| Silicon Wafer silylated by HMDS in $SCFCO_2$ | 87 |
| Glass slide (untreated) | 21 |
| After silylation by HMDS in $SCFCO_2$ | 59 |

EXAMPLE 2

A silicon wafer coated with a diazoquione-novolak I line resist was treated with 2 HMDS in supercritical $CO_2$ at 6000 psi and 70 C. for 15 minutes.

An infrared spectrum was run of the film vs an untreated sample to ascertain from the IR —SiO stretch band if silicon atom was incoporated in the resist film. FIG. 1 shows spectrum of novolak I line resist control with prominent —OH band at 3300.cm$^{-1}$.

Figure 2:
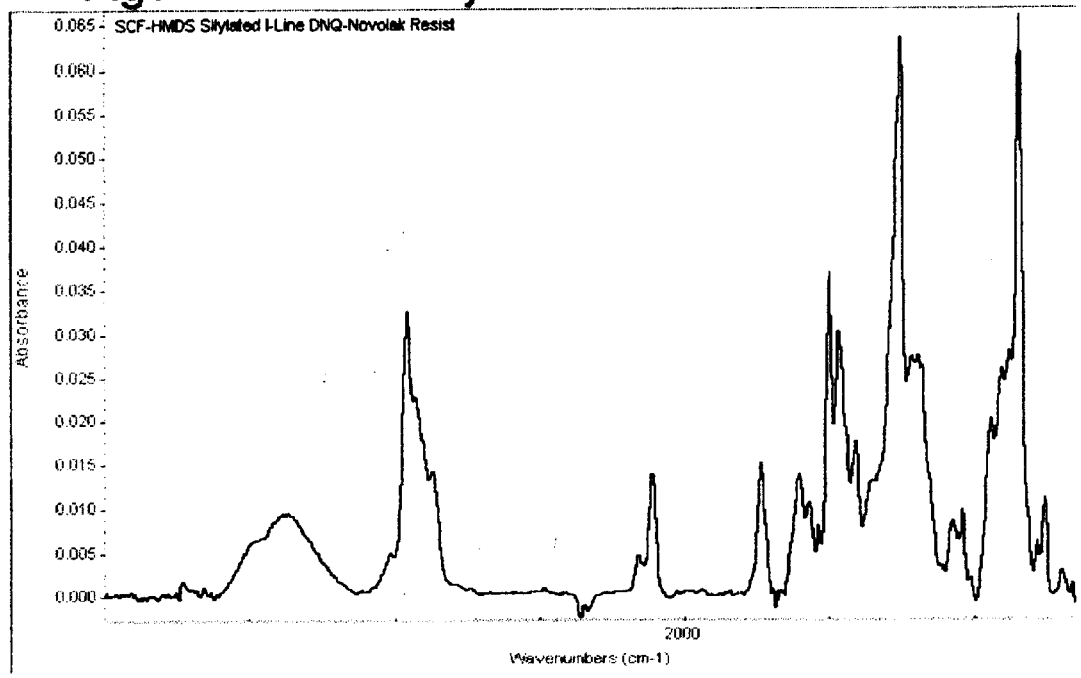
FIG. 2 depicts the HMDS/SCF treated spectrum of Novolak I.

FIG. 2 shows HMDS/SCF treated spectrum with significant loss of —OH band indicating conversion to —OSi (CH$_3$)$_3$.

The process of silylation thus involves treating the silicon wafer of resist film or imaged resist film, e.g., for top surface imaging with a silylation agent. Time, temperature, pressure of the SCF and the concentration of silylation agent (weight or mole fraction) dissolved in CO$_2$ liquified phase, as well as the molecular structure of the silylation agent (size, reactivity) are variables which control the rate or extent of silylation. These are varied according to the result desired.

The results shown above demonstrate that it is possible to effectively silylate the surface of a workpiece under conditions that avoid the use of highly flammable materials as is common in the prior art, and to effectively silylate in a manner that affords rapid and complete conversion with the additional benefit of being able to selectively tune the temperature, pressure and time of the process to thereby affect modifications in the extent of the silylation process.

Elements of the process described above are used in a silylation process carried out in a liquid fluid or a supercritical fluid as the solvent for the reaction media in the organic synthesis of a desired composition at the bulk level.

For example, the silylating agents stated in detail hereinafter can be used to introduce a trimethyl silyl group onto a variety of alcohols and the reaction product thereof can be produced on a commercial scale using the techniques of the instant process. In general the least sterically hindered alcohols are the most readily silylated. HMDS is most commonly used to silylate alcohols, acids, amines, thiols, phenols, hydroxamic acids, amides, thioamides, sulfonamides, phosphoric amides, phosphites, hydrazines, and enolizable ketones.

The bulk reaction silylation reaction occurs at room temperature to 100° C. The solubilities of the various compounds detailed must be considered when reacting with the silylation reagents mentioned hereinafter. Ideally a homogeneous solution is utilized in the reaction.

The silylation agents that are conveniently used in accordance with the bulk production of chemical compounds aspect of the present invention are preferably HMDS; Me$_3$SiCl with Et3N, THF, or Li$_2$S CH$_3$CN; (Me$_3$Si)$_2$NH and Me$_3$SiCl, Pyridine; Me$_3$SiNEt$_2$; CH$_3$C(OSiMe$_3$)=NSiMe$_3$; Me$_3$SiCH$_2$CO$_2$Et; Me$_3$SiNHSO$_2$OSiMe$_3$ with CH$_2$Cl$_2$; Me$_3$SiNHCO$_2$SiMe$_3$; Me=C(OMe)OSiMe$_3$; Me$_3$SiCH$_2$CH=CH; (Me$_3$SiO)$_2$ SO$_2$; N,O-Bis(trimethylsilyl)trifluroacetamide; N,N'-Bistrimethylsilylurea; Me$_3$SiSEt; Isopropenyloxytrimethylsilane; Methyl 3-trimethylsiloxy-2-butenoate; N-methyl-N-trimethylsilylacetamide; trimethylsilyl cyanide; Me$_3$SiOC(O)NMe$_3$; trimethylsilylimidazole; trimethylsilyl trichloroacetate; 3-Trimethylysilyloxazolidinone; trimethylysilyl trifluoromethanesulfonate.

EXAMPLE 3

Figure 3:
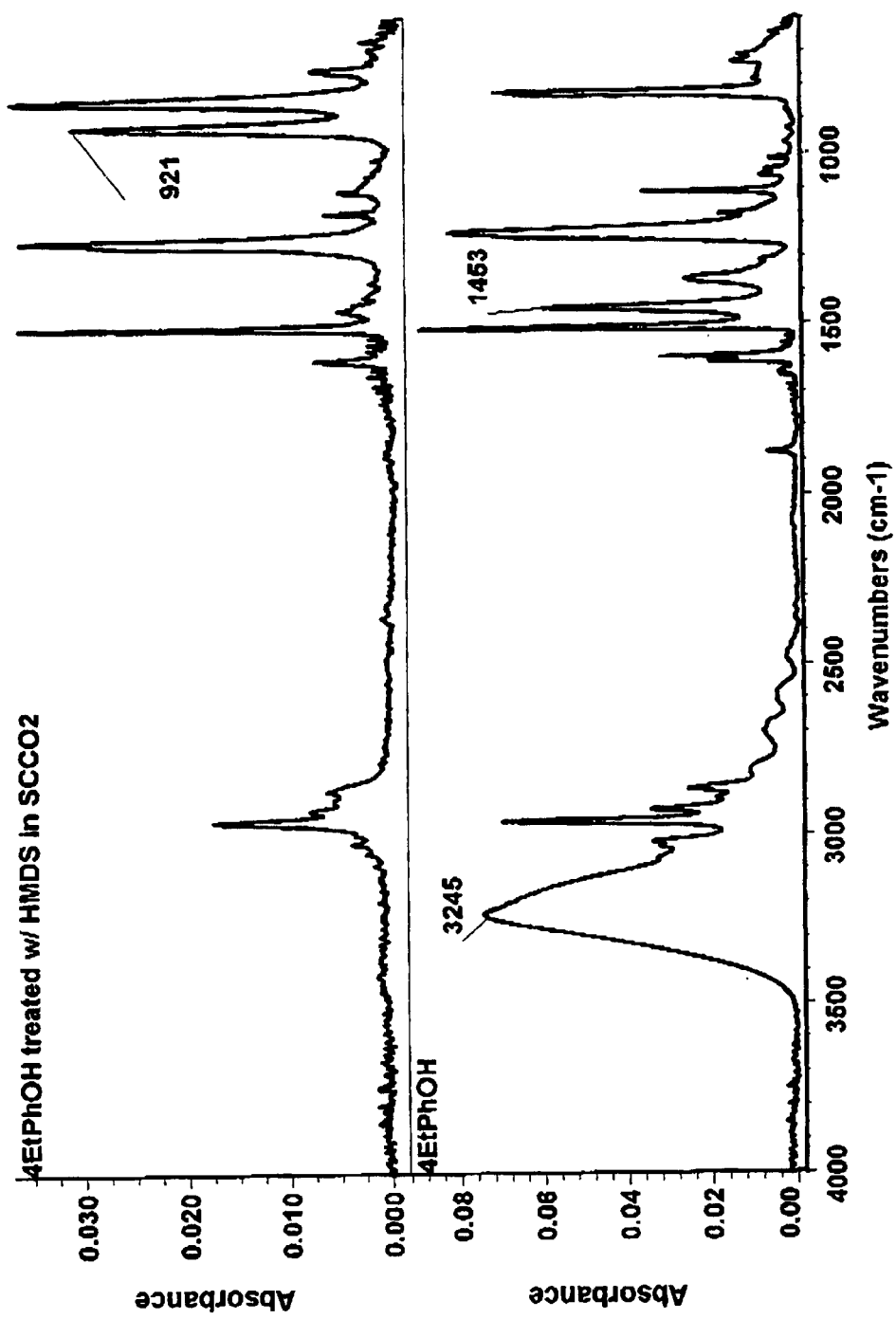
FIG. 3 is an IR spectrum before and after treatment of 4ethylpenol with HMDS.

A sample of 4-ethylphenol was pretreated to remove traces of water contained therein and then was contacted in a reaction chamber with a mixture of HMDS (2 wt % dissolved in supercritical CO$_2$ at 3000 psi and 40° C. for a period of 15 minutes). The sample was soluble in the CO$_2$. After sufficient time to react, the CO$_2$ was vented off and the reaction product precipitates out and was tested for purity. FIG. 3 shows an infra-red spectrum before and after treatment of 4-ethylphenol with HMDS. Complete conversion to silylated ethylphenol was noted. (loss of OH at 3245 cm$^{-1}$)

EXAMPLE 4

Using the procedure described in Example 3 hereinabove, the sample so defined and a methanol, ethaqnol and a carbohydrate are contacted with the following silylation agents: Me$_3$SiCl with Et3N, THF, or Li$_2$S CH$_3$CN; (Me$_3$Si)$_2$NH and Me$_3$SiCl, Pyridine; Me$_3$SiNEt$_2$; CH$_3$C(OSiMe$_3$)=NSiMe$_3$; Me$_3$SiCH$_2$CO$_2$Et; Me$_3$SiNHSO$_2$OSiMe$_3$ with CH$_2$Cl$_2$; Me$_3$SinhCO$_2$SiMe$_3$; Me=C(OME)OSiMe$_3$;Me$_3$SiCH$_2$CH=CH; (Me$_3$SiO)$_2$SO$_2$; N,O-Bis(trimethylsilyl)trifluoroacetamide; N,N'-Bistrimethylsilylurea; Me$_3$SiSEt; Isopropenyloxytrimethylsilane; Methyl 3-trimethylsiloxy-2-butenoate; N-methyl-N-trimethylsilylacetamide; trimethylsilyl cyanide; Me$_3$SiOC(O)NMe$_3$; trimethylsilylimidazole; trimethylsilyl trichloroacetate; 3-Trimethylysilyloxazolidinone; trimethylysilyl trifluoromethanesulfonate. Suitable reaction product compounds similar to that formed in Example 3 above are formed.

Thus while there have been shown and described and pointed out fundamental novel features of the invention as applied to currently preferred embodiments thereof, it will be understood that various omissions and substitutions and changes in the form and details of the method and apparatus illustrated, and in their operation, may be made by those skilled in the art without departing from the spirit of the invention. In addition, it is to be understood that the drawings are not necessarily drawn to scale but that they are merely conceptual in nature. It is the intention, therefore, to be limited only as indicated by the scope of the claims.

What we claim and desire to protect by Letters Patent is:

1. A method of silylation of workpiece surface, film, or fabric, comprising contacting the workpiece surface, film, or fabric, with a silylation agent and a supercritical liquid fluid.

2. The method defined in claim 1 wherein said supercritical liquid fluid is CO$_2$.

3. The method defined in claim 1 wherein said silylation agent is an organosilicon compound selected from compounds having the following molecular formulas: SiR$_y$X$_{4-y}$ and (R$_w$ X$_{3-w}$ Si)$_2$ Z, wherein:
  y=1 to 4;
  w=1 to 3;
  R=alkyl, aryl, H, alkoxy, arylalkyl, fluoro, fluoroalkyl and where applicable, R has from 1 to 10 carbon atoms;
  X=halide; and
  Z=oxygen or amino or imino or alkylimino or alkanoylimino.

4. The method defined in claim 1 wherein said silylation agent comprises reactive aminosilanes, R$_n$SiX, where R is aryl, alkyl alkoxy, fluoroaklyl, fluoraryl, fluoroalkoxy, and X is a halogen, amino, epoxy, isocyanate, OH, or acid group.

5. The method defined in claim 1 wherein said workpiece surface comprises silicon, germanium, or silicon dioxide.

6. The method defined in claim 1 comprising a film which comprises a photoresist containing reactive sites selected from the group consisting of phenol groups, acid groups, or epoxy groups.

7. The method defined in claim 1 comprising a fabric made from a textile comprising fibers with reactive sites selected from the group of alcohol(—OH), phenolic, amino, —COOH or epoxy groups.

8. The method defined in claim 1 comprising a workpiece made from lignin materials which have reactive sites capable of silylation.

9. The method defined in claim 1 comprising a bulk organic synthesis of silylation carried out in supercritical liquid fluid as solvent for the reaction media.

10. The method defined in claim 9 wherein said workpiece surface comprises, silicon germanium, aluminum, tin, titanium, zinc or silicon dioxide.

11. The method defined in claim 9 wherein said workpiece is a film which comprises a photoresist containing reactive sites selected from the group consisting of phenol groups, acid groups, or epoxy groups.

12. The method defined in claim 1 wherein said workpiece is selected from the group consisting of a semiconductor surface, a film, and a fabric;

said silylation agent is an organosilicon compound selected from compounds having the following molecular formulas: $SiR_yX_{4-y}$ and $(R_w X_{3-w} Si)_2 Z$, wherein:

y=1 to 4;

w=1 to 3;

R=alkyl, aryl, H, alkoxy, arylalkyl, fluoro, fluoroalkyl and where applicable, R has from 1 to 10 carbon atoms;

X=halide; and

Z=oxygen or amino or imino or alkylimino or alkanoylimino;

and said fluid is $CO_2$.

13. The method defined in claim 12 wherein said workpiece is made from lignin materials having sites capable of silylation.

14. The method defined in claim 1 wherein said workpiece is selected from the group consisting of a semiconductor surface, a film, and a fabric;

said silylation agent comprises reactive aminosilanes, $R_nSiX$, where R is aryl, alkyl alkoxy, fluoroalkyl, fluoraryl, fluoroalkoxy, and X is a halogen, amino, epoxy, isocyanate, —OH, or acid group and n is 1–4, and said fluid is $CO_2$;

said reaction being carried at a pressure of between about 1069 psi and 10,000 and at a temperature of about 31° C.

15. The method defined in claim 14 wherein said $CO_2$ fluid contains up to 10% by weight of a cosolvent selected from the group consisting of cyclohexanone, N-methyl pyrrolidone, THF, ethane and acetonitrile.

16. The method defined in claim 1 wherein said workpiece is a silicon wafer; and said silylation agent is selected from the group consisting of tetra alkyl orthosilicates, $Si(OR)_4$, and poly(alkyl)siloxanes, tetraethyl orthosilicate, also known as tetraethoxysilane, poly(phenylmethyl) siloxane, dimethyl silicone, diethyl silicone, phenylmethyl silicone, methylhydrogen silicone, ethylhydrogen silicone, phenylhydrogen silicone, methylethyl silicone, phenylethyl silicone, diphenyl silicone, methyltrifluoropropyl silicone, ethyltrifluoropropyl silicone, polydimethyl silicone, tetrachlorophenylethyl silicone, tetrachlorophenylmethyl silicone, tetrachlorophenylhydrogen silicone, tetrachlorophenylphenyl silicone, methylvinyl silicone and ethylvinyl silicone cyclic silicones include hexamethyl cyclotrisiloxane, octamethyl cyclo-tetrasiloxane, hexaphenyl cyclotrisiloxane and octaphenyl cyclotetrasiloxane and mixtures thereof; said reaction being carried at a pressure of between about 1069 psi and 10,000 and at a temperature of about 31° C.

17. The method defined in claim 1 wherein said workpiece is a fabric made from a textile comprising fibers with reactive sites selected from the group of alcohol(—OH), phenolic, amino, —COOH or epoxy groups;

said silylation agent is an organosilicon compound selected from compounds having the following molecular formulas: $SiR_yX_{4-y}$ and $(R_w X_{3-w} Si)_2 Z$, wherein:

y=1 to 4;

w=1 to 3;

R=alkyl, aryl, H, alkoxy, arylalkyl, fluoro, fluoroalkyl and where applicable, R has from 1 to 10 carbon atoms;

X=halide; and

Z=oxygen or amino or imino or alkylimino or alkanoylimino;

and said fluid is $CO_2$; said reaction being carried at a pressure of between about 1069 psi and 10,000 and at a temperature greater than 31° C.

18. The method defined in claim 1 wherein said workpiece is a resist having a reactive moiety located substantially on the surface thereof;

said silylation agent is hexamethyl disilazane (HMDS);

said fluid is $CO_2$;

and the reaction being carried at a pressure of between about 1069 psi and 10,000 and at a temperature greater than 31° C.

19. A method for silylation of a chemical compounds, comprising contacting a mixture of a silylation agent selected from the group consisting of HMDS, $Me_3SiCl$ with Et3N, THF, or $Li_2S$ $CH_3CN$; $(Me_3Si)_2NH$ and $Me_3SiCl$, Pyridine; $Me_3SiNEt_2$; $CH_3C(OSiMe_3)=NSiMe_3$; $Me_3SiCH_2CO_2Et$; $Me_3SiNHSO_2OSiMe_3$ with $CH_2Cl_2$; $Me_3SiNHCO_2SiMe_3$; $Me=C(OMe)OSiMe_3$; $Me_3SiCH_2CH=CH$; $(Me_3 SiO)_2 SO_2$; N,O-Bis(trimethylsilyl)trifluoroacetamide; N,N'-Bistrimethylsilylurea; $Me_3SiSEt$; Isopropenyloxytrimethylsilane; Methyl 3-trimethylsiloxy-2-butenoate; N-methyl-N-trimethylsilylacetamide; trimethylsilyl cyanide; $Me_3SiOC(O)NMe_3$; trimethylsilylimidazole; trimethylsilyl trichloroacetate; 3-Trimethylsilyloxazolidinone; and trimethylsilyl trifluoromethanesulfonate, and a supercritical liquid fluid.

* * * * *